United States Patent
Kajiwara et al.

(10) Patent No.: US 8,443,310 B2
(45) Date of Patent: May 14, 2013

(54) PATTERN CORRECTING METHOD, MASK FORMING METHOD, AND METHOD OF MANUFACTURING SEMICONDUCTOR DEVICE

(75) Inventors: Masanari Kajiwara, Kanagawa (JP); Toshiya Kotani, Tokyo (JP); Sachiko Kobayashi, Chiba (JP); Hiromitsu Mashita, Kanagawa (JP); Fumiharu Nakajima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/237,435

(22) Filed: Sep. 20, 2011

(65) Prior Publication Data

US 2012/0246601 A1    Sep. 27, 2012

(30) Foreign Application Priority Data

Mar. 23, 2011    (JP) ................................. 2011-064318

(51) Int. Cl.
*G06F 17/50*    (2006.01)
(52) U.S. Cl.
USPC ................... 716/54; 716/50; 716/51; 716/52; 716/53; 716/55; 716/139; 430/5; 430/30
(58) Field of Classification Search ............. 716/50–55, 716/139; 430/5, 30
See application file for complete search history.

(56) References Cited

U.S. PATENT DOCUMENTS

| 7,315,999 B2 * | 1/2008 | Melvin et al. ................... 716/52 |
| 7,444,609 B2 * | 10/2008 | Charlebois et al. ........... 716/119 |
| 7,917,871 B2 | 3/2011 | Kobayashi et al. |
| 2008/0098341 A1 * | 4/2008 | Kobayashi et al. ............... 716/9 |
| 2011/0029937 A1 * | 2/2011 | Kodera et al. ................... 716/52 |

FOREIGN PATENT DOCUMENTS

| JP | 2001-272766 | 10/2001 |
| JP | 2008-058428 | 3/2008 |
| JP | 2008-145691 | 6/2008 |

* cited by examiner

*Primary Examiner* — Nghia Doan
(74) *Attorney, Agent, or Firm* — Finnegan, Henderson, Farabow, Garrett & Dunner, L.L.P.

(57) ABSTRACT

A pattern correcting method of an embodiment computes a distribution of pattern coverages on a design layout of a circuit pattern in the vicinity of a position that becomes an error pattern in a case where an on-substrate pattern is formed. Then, an area on the design layout in which a difference in the distribution of the pattern coverages becomes small by adding an addition pattern is set as an addition area. Next, addition pattern candidates to be added to the addition area are generated, an addition pattern to be added to the design layout is selected from the candidates on the basis of a predetermined selection criterion, and the addition pattern is added to the addition area.

20 Claims, 7 Drawing Sheets

PATTERN CORRECTING METHOD, MASK FORMING METHOD, AND METHOD OF MANUFACTURING SEMICONDUCTOR DEVICE

CROSS-REFERENCE TO RELATED APPLICATIONS

This application is based upon and claims the benefit of priority from Japanese Patent Application No. 2011-064318, filed on Mar. 23, 2011; the entire contents of which are incorporated herein by reference.

FIELD

Embodiments described herein relate generally to a pattern correcting method, a mask forming method, and a method of manufacturing a semiconductor device.

BACKGROUND

With miniaturization of semiconductor elements, it is becoming increasingly difficult to form patterns the same as in a design layout on a substrate such as a wafer. One of the reasons is that the improvement in resolution of exposure devices has not caught up with advances in miniaturization of semiconductor elements so that the transfer qualities of patterns in a lithography process are deteriorated increasingly.

Quality deterioration patterns (error patterns), which demonstrate a significant reduction in the transfer quality, have a tremendous influence on the production yield. As a matter of fact, even if patterns comply with design constraints (design rules), the error patterns may be mixed into design circuit patterns.

In order to eliminate those error patterns, it is required to specify the positions of the error patterns and correct the design layout, particularly, of the vicinities of the error patterns. However, in connection with the elimination of the error patterns, a huge amount of effort is required to correct the design layout. For this reason, it is desirable to effectively correct the design layout of the vicinities of the error patterns.

DETAILED DESCRIPTION

According to an embodiment, a pattern correcting method is provided. In the pattern correcting method, an on-substrate pattern corresponding to a design layout of a circuit pattern is formed on a substrate, and a pattern coverage distribution on the design layout in the vicinity of a position where the on-substrate pattern becomes an error pattern is computed. Then, an area on the design layout where a difference in the distribution of pattern coverages becomes small by adding an addition pattern is added to the design layout is set as an addition area. Next, candidates for the addition pattern to be added to the addition area are generated. Then, the addition pattern to be added to the design layout is selected from the addition pattern candidates on the basis of a predetermined selection criterion, and is added to the addition area.

Hereinafter, the pattern correcting method, a mask forming method, and a method of manufacturing a semiconductor device according to embodiments will be described in detail with reference to the accompanying drawings. However, the present invention is not limited by the embodiments.

Embodiments

Figure 1:
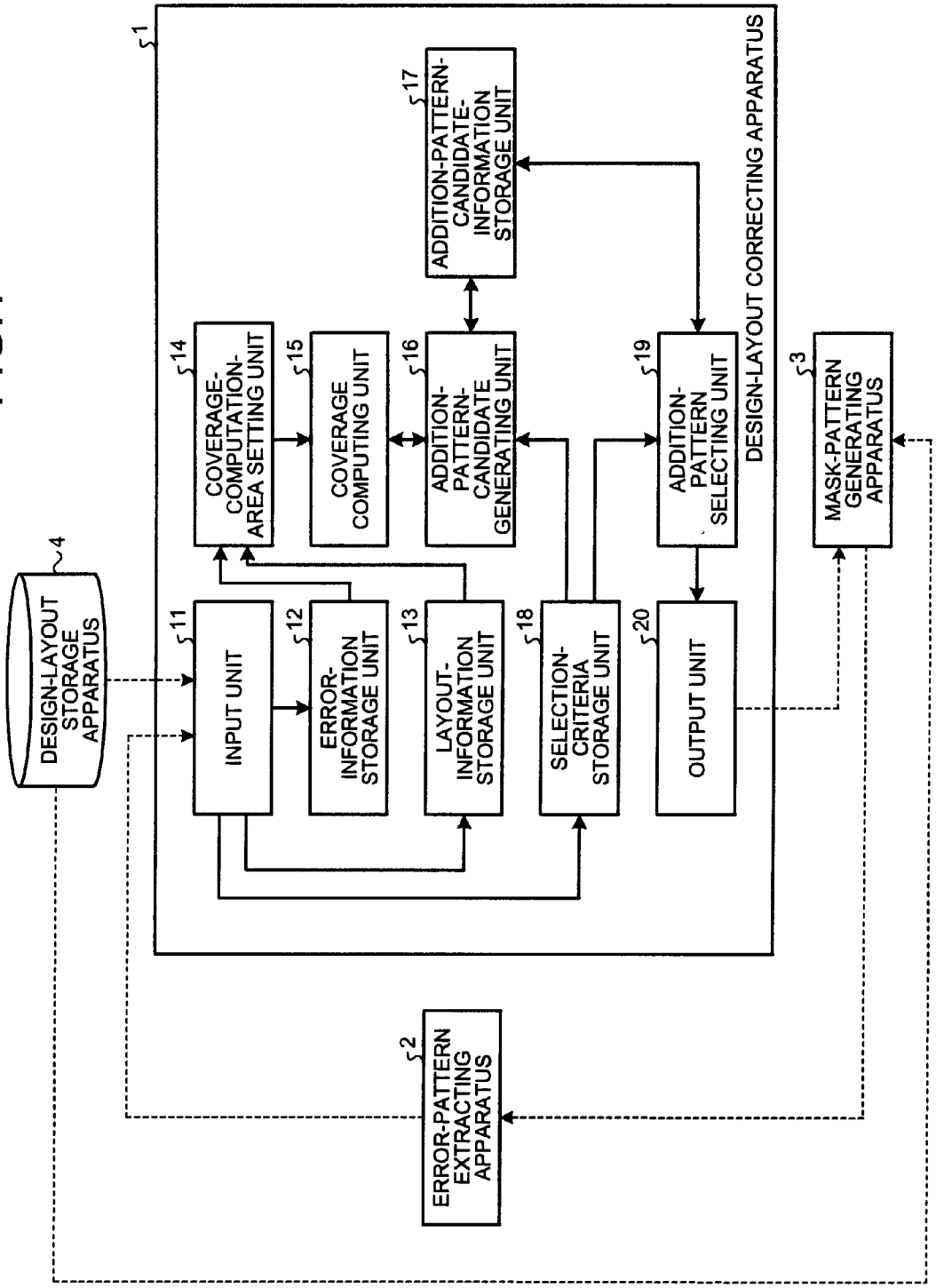
FIG. 1 is a block diagram illustrating a configuration of a design-layout correcting apparatus according to an embodiment.

FIG. 1 is a block diagram illustrating a configuration of a design-layout correcting apparatus according to an embodiment. A design-layout correcting apparatus 1 is an apparatus such as a computer for correcting a design layout of a circuit pattern (semiconductor device). The design-layout correcting apparatus 1 according to the present embodiment adds an addition pattern to a design layout so as to reduce a change in pattern coverage (pattern density) in the vicinity of an error-pattern occurrence position, thereby correcting the design layout. For example, in a case where a position with a high pattern density and a position with a low pattern density are adjacent to each other in a predetermined area on the design layout, a change in pattern coverage becomes large between those positions. For this reason, in the present embodiment, a predetermined addition pattern (design pattern) is added to a position with a low pattern density in the vicinity of an error-pattern occurrence position.

The design-layout correcting apparatus 1 is connected to an error-pattern extracting apparatus 2, a design-layout storage apparatus 4, and a mask-pattern generating apparatus 3. The design-layout storage apparatus 4 is an apparatus for storing a design layout of a semiconductor device. The error-pattern extracting apparatus 2 is an apparatus for extracting a position of an error pattern (error occurrence edge), which is a hot spot, from the design layout stored in the design-layout storage apparatus 4.

In the present embodiment, the error pattern is a quality deterioration pattern having a significant reduction of the transfer quality (a pattern that has the potential to be a defective pattern higher than a predetermined value) in a case where a circuit pattern corresponding to a design layout has been formed on a substrate such as a wafer. In other words, the error pattern is a pattern of which on-wafer pattern (such as a resist pattern or a processed pattern) does not become a shape within a desired range when the on-wafer pattern is formed on a wafer. The error pattern is, for example, a pattern (open-circuited pattern) which is disconnected when an on-wafer pattern is formed, or a pattern (short-circuited pattern) that is short-circuited between adjacent patterns in a case where an on-wafer pattern is formed.

The design-layout correcting apparatus 1 includes an input unit 11, an error-information storage unit 12, a layout-information storage unit 13, a coverage-computation-area setting unit 14, a coverage computing unit 15, an addition-pattern-candidate generating unit 16, an addition-pattern-candidateinformation storage unit 17, a selection-criteria storage unit 18, an addition-pattern selecting unit 19, and an output unit 20.

The input unit 11 is used to input various kinds of information required to correct the design layout. Information (error pattern information) on a position of an error pattern extracted by the error-pattern extracting apparatus 2, the design layout (design data of a circuit pattern) stored in the design-layout storage apparatus 4, and the like are input to the input unit 11. Further, addition pattern selection criteria and the like are input to the input unit 11. The addition pattern selection criteria are information regarding setting of priorities for selection which is referred to when an addition pattern is selected from candidates for the addition pattern (correction layout candidates) to be added to the design layout. The addition pattern selection criteria are designated by, for example, a user.

The input unit 11 transmits the error pattern information from the error-pattern extracting apparatus 2 to the error-information storage unit 12. Further, the input unit 11 transmits the design layout from the design-layout storage apparatus 4 to the layout-information storage unit 13. Furthermore, the input unit 11 transmits the addition pattern selection criteria to the selection-criteria storage unit 18.

The error-information storage unit 12 may be a memory or the like for storing the error pattern information. The layout-information storage unit 13 may be a memory or the like for storing the design layout. The selection-criteria storage unit 18 may be a memory or the like for storing the addition pattern selection criteria.

The coverage-computation-area setting unit 14 sets a plurality of coverage computation areas (areas to be subjects of coverage computation) for each error pattern, on the basis of the error pattern information in the error-information storage unit 12. A coverage computation area is a pattern area in the vicinity of an error pattern, and is set to have a predetermined size. The coverage computation area may be a rectangular area which has a center at a predetermined position and specified with lines, the lines have predetermined distances in an X direction and a Y direction from the predetermined position. The coverage-computation-area setting unit 14 transmits the set coverage computation areas to the coverage computing unit 15.

On the basis of the coverage computation areas from the coverage-computation-area setting unit 14, the coverage computing unit 15 computes a pattern coverage (a coverage map) in each of the coverage computation areas as an uncorrected pattern coverage for the corresponding coverage computation area.

In addition, the coverage computing unit 15 computes a pattern coverage (corrected pattern coverage) in each of the coverage computation areas when an addition pattern candidate generated by the addition-pattern-candidate generating unit 16 is disposed on the design layout. The uncorrected pattern coverage is a pattern coverage before the addition pattern is added, and the corrected pattern coverage is a pattern coverage after the addition pattern is added. The coverage computing unit 15 computes the uncorrected coverages and the corrected coverages in the coverage computation areas for each error pattern. The coverage computing unit 15 transmits the computed uncorrected and corrected pattern coverages to the addition-pattern-candidate generating unit 16.

The addition-pattern-candidate generating unit 16 selects a coverage computation area, which is close to an area (which is an addition pattern layout area to be described below) to which the addition pattern will be added, from the coverage computation areas, on the basis of the uncorrected pattern coverages computed by the coverage computing unit 15. The addition-pattern-candidate generating unit 16 selects a coverage computation area for each error pattern. Further, the addition-pattern-candidate generating unit 16 generates shape candidates and position candidates for the addition pattern to be added to the selected coverage computation area, as addition pattern candidates. The addition-pattern-candidate generating unit 16 associates the positions of error patterns, addition pattern candidates, uncorrected pattern coverages, and corrected pattern coverages with one another, and transmits the associated information as the addition-pattern-candidate information to the addition-pattern-candidate-information storage unit 17.

The addition-pattern-candidate-information storage unit 17 may be a memory or the like for storing the addition-pattern-candidate information generated by the addition-pattern-candidate generating unit 16.

The addition-pattern selecting unit 19 selects an addition pattern for each error pattern to be applied to correct the design layout, from the addition pattern candidates, on the basis of the addition pattern selection criteria in the selection-criteria storage unit 18 and the addition-pattern-candidate information in the addition-pattern-candidate-information storage unit 17. For example, the addition-pattern selecting unit 19 selects an addition pattern to reduce a difference (an amount of change) in the distribution of the corrected pattern coverages between the coverage computation areas. In other words, the addition-pattern selecting unit 19 selects an addition pattern (correction shape candidate) to make the change in the coverage modest. The addition-pattern selecting unit 19 adds the selected addition pattern to the design layout, and transmits the design layout with the addition pattern to the output unit 20.

The output unit 20 outputs the design layout with the addition pattern to an external apparatus such as the mask-pattern generating apparatus 3, if necessary. The mask-pattern generating apparatus 3 is an apparatus for generating a mask pattern using the design layout before the addition pattern is added and the design layout after the addition pattern is added.

Figure 2:
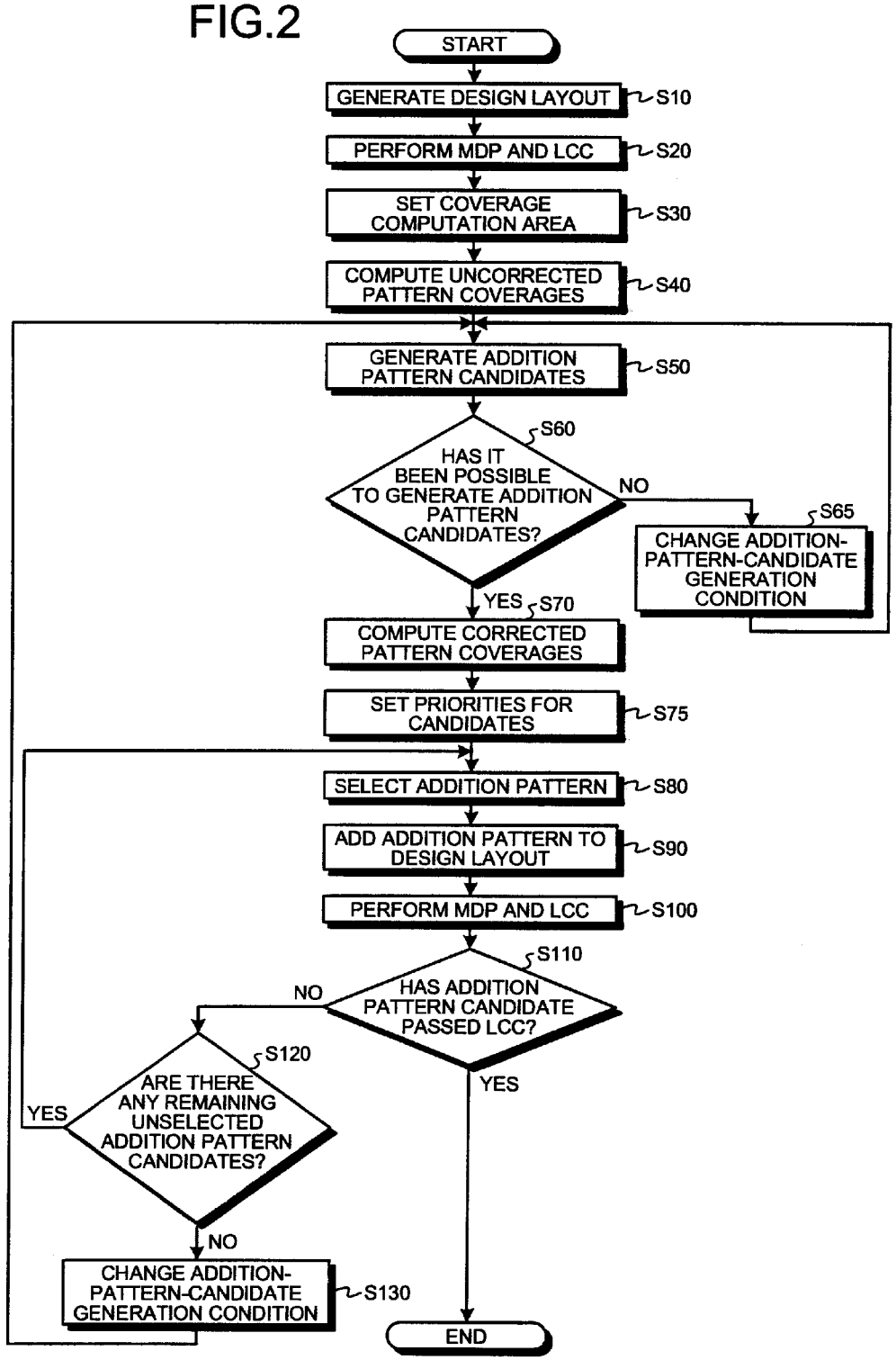
FIG. 2 is a flowchart illustrating a procedure of a design-layout correcting process according to an embodiment.

Next, a procedure of the design-layout correcting process will be described. FIG. 2 is a flowchart illustrating a procedure of a design-layout correcting process according to an embodiment. If a design layout of a semiconductor device is generated by a design-layout generating apparatus in step S10, the generated design layout is stored in the design-layout storage apparatus 4. Further, the generated design layout is transmitted to the mask-pattern generating apparatus 3.

The mask-pattern generating apparatus 3 generates a mask pattern using the design layout. Specifically, the mask-pattern generating apparatus 3 performs mask data preparation (MDP) such as optical proximity correction (OPC) on the design layout, so as to generate a mask pattern. In other words, the mask-pattern generating apparatus 3 performs a mask data process including the OPC based on an OPC model, thereby generating mask data from the design layout. The generated mask pattern is transmitted to the error-pattern extracting apparatus 2.

The error-pattern extracting apparatus 2 computes a pattern shape in a case where the mask pattern is used to form an on-wafer pattern on a wafer. Specifically, the error-pattern extracting apparatus 2 computes a pattern shape of an on-wafer pattern in a case of forming a mask using the mask pattern and performing a lithographic process on a wafer by using the formed mask. At this time, the error-pattern extracting apparatus 2 computes the pattern shape of the on-wafer pattern by performing a lithographic simulation using the mask pattern.

Then, the error-pattern extracting apparatus 2 extracts a position of an error pattern (a lithographically hazardous position sensitive to a change in process), on the basis of the computed pattern shape and a preset pattern-shape allowance range. Specifically, the error-pattern extracting apparatus 2 extracts a position of an error pattern by a lithography compliance checking (LCC) process or the like in step S20.

The design layout stored in the design-layout storage apparatus 4 is input to the input unit 11 of the design-layout correcting apparatus 1. Further, the addition pattern selection criteria are input to the input unit 11, as selection criteria for an addition pattern to be added to the design layout.

In the addition pattern selection criteria, for example, a criterion (first criterion) to preferentially select an addition pattern candidate for reducing the amount of change in the corrected pattern coverage between the coverage computation areas is set.

In addition, in the addition pattern selection criteria, for example, a criterion (second criterion) to preferentially select an addition pattern candidate for shortening a distance between the error pattern and the addition pattern may be set.

Alternatively, both of the first criterion and the second criterion may be set in the addition pattern selection criteria. Further, as the addition pattern selection criteria, the priorities may be set for the first criterion and the second criterion. For example, in a case where the priority of the first criterion is set to be higher than the priority of the second criterion, an addition pattern candidate nay be selected on the basis of the first criterion. Then, if a plurality of addition pattern candidates is selected by the first criterion, an addition pattern candidate nay be selected on the basis of the second criterion. Further, points according to priorities may be set for the first criterion and the second criterion, and a priority may be set on the basis of the total value of the points of the first criterion and the second criterion.

In addition, information on the position of the error pattern extracted by the error-pattern extracting apparatus 2 is input as the error pattern information to the input unit 11. In other words, a result of the MDP/LCC on the design layout is input as the error pattern information to the input unit 11.

The input unit 11 transmits the error pattern information to the error-information storage unit 12, transmits the design layout to the layout-information storage unit 13, and transmits the addition pattern selection criteria to the selection-criteria storage unit 18. The coverage-computation-area setting unit 14 sets the coverage computation areas in the design layout in the layout-information storage unit 13 on the basis of the error pattern information in the error-information storage unit 12.

Figure 3:
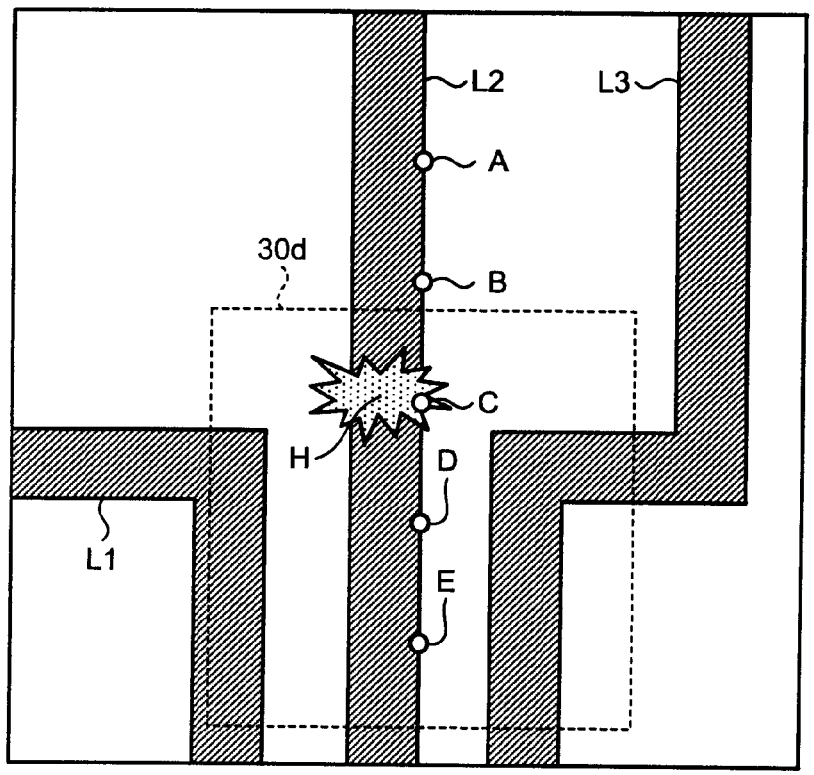
FIG. 3 is a diagram for explaining a coverage computation area.

FIG. 3 is a diagram for explaining a coverage computation area. FIG. 3 is a top view illustrating a portion of a design layout in which an error pattern (hot spot) H occurs. The error pattern information includes information on the position of the error pattern H, and various patterns are in the vicinity of the error pattern H. FIG. 3 shows a case where the error pattern H is on a line pattern L2, and line patterns L1 and L3 are in the vicinity of the error pattern H (line pattern L2).

The coverage-computation-area setting unit 14 sets coverage computation areas for the error pattern H in step S30. The coverage computation areas are rectangular areas set in the vicinity of the error pattern H.

The coverage-computation-area setting unit 14 of the present embodiment sets a plurality of coverage computation areas that has, for example, the position (evaluation point) on the line pattern L2 where the error pattern H occurs, as a center. Specifically, the coverage-computation-area setting unit 14 sets the position of the error pattern H on the line pattern L2 as an evaluation point C for computing an uncorrected pattern coverage. Then, the coverage-computation-area setting unit 14 sets an evaluation point A, an evaluation point B, an evaluation point D, and an evaluation point E at positions on the line pattern L2 spaced apart from the position of the error pattern H by predetermined distances, as evaluation points for computing the uncorrected pattern coverages. The evaluation point C which becomes a center of the evaluation points A to E for computing the uncorrected pattern coverages corresponds to the error pattern H. In this way, a plurality of evaluation points is set in a one-dimensional direction on the design layout pattern.

Further, the coverage-computation-area setting unit 14 sets an area which is in a predetermined range from each of the evaluation points A to E, as a coverage computation area. Each coverage computation area is, for example, a rectangular area that has each of the evaluation points A to E as a center and specified with lines, the lines have predetermined distances in an X direction and a Y direction from each of the evaluation points A to E. FIG. 3 shows a coverage computation area 30d for the evaluation point D. The coverage-computation-area setting unit 14 transmits each of the coverage computation areas for the evaluation points A to E to the coverage computing unit 15.

The coverage computing unit 15 computes pattern coverages in the coverage computation areas corresponding to the evaluation points A to E as the uncorrected pattern coverages in step S40. The coverage computing unit 15 transmits the computed uncorrected pattern coverages to the addition-pattern-candidate generating unit 16.

The addition-pattern-candidate generating unit 16 selects a predetermined coverage computation area from the coverage computation areas on the basis of the uncorrected pattern coverages computed by the coverage computing unit 15. Specifically, the addition-pattern-candidate generating unit 16 selects a coverage computation area corresponding to an addition pattern layout area to which the addition pattern will be added, from the coverage computation areas. The addition pattern layout area is an area to which the addition pattern will be actually added, and is an area including at least a portion of the selected coverage computation area. The addition-pattern-candidate generating unit 16 selects a coverage computation area such that a difference in the distribution of the uncorrected pattern coverages is reduced by adding the addition pattern. Then, the addition-pattern-candidate generating unit 16 sets the addition pattern layout area according to the selected coverage computation area.

Figure 4:
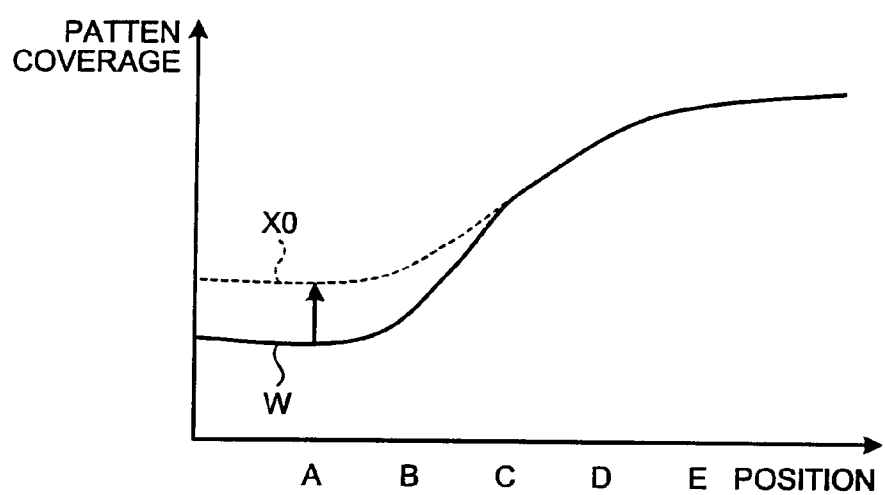
FIG. 4 is a diagram illustrating a pattern coverage of each coverage computation area candidate.

FIG. 4 is a diagram illustrating the pattern coverage of each of the coverage computation areas. In FIG. 4, a horizontal axis represents the evaluation points A to E on the line pattern L2, and a vertical axis represents the value of the pattern coverage. Further, a distribution of the uncorrected pattern coverages is shown as a distribution W, and a distribution of the corrected pattern coverages is shown as a distribution X0. For example, if the addition pattern is added to the evaluation point A, an amount of change in corrected pattern coverage becomes smaller than an amount of change in uncorrected pattern coverage. In other words, if the addition pattern is added to the evaluation point A, the inclination of the corrected pattern coverage becomes smooth. In this case, for example, the coverage computation area corresponding to the evaluation point A is selected.

Figure 5:
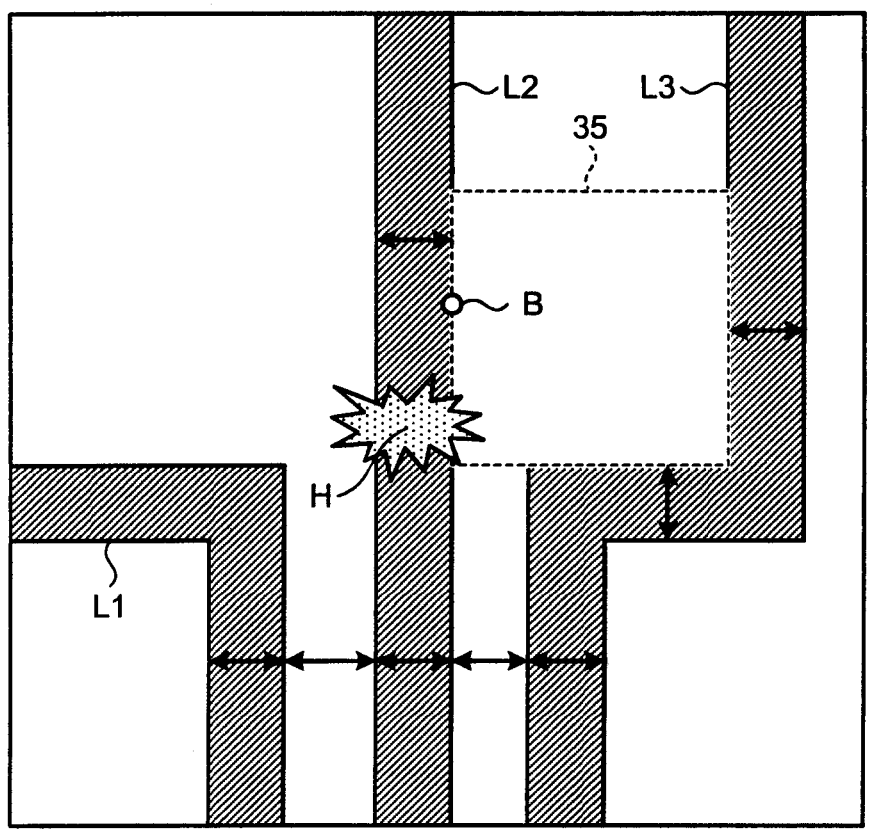
FIG. 5 is a diagram for explaining an addition pattern layout area.
Figure 6A:
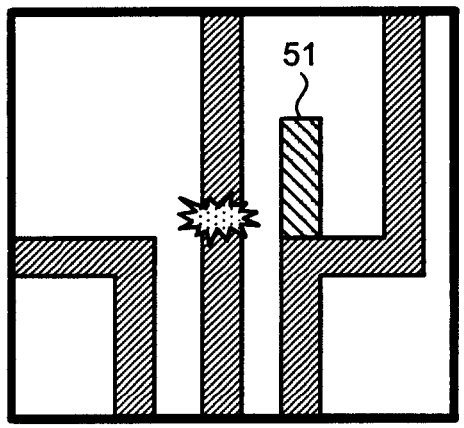
FIGS. 6A to 6D are diagrams illustrating examples of addition pattern candidates.
Figure 6B:
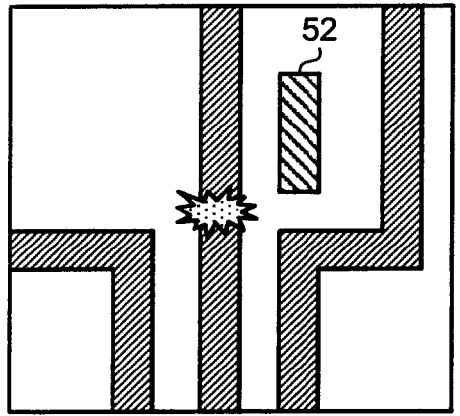
Figure 6C:
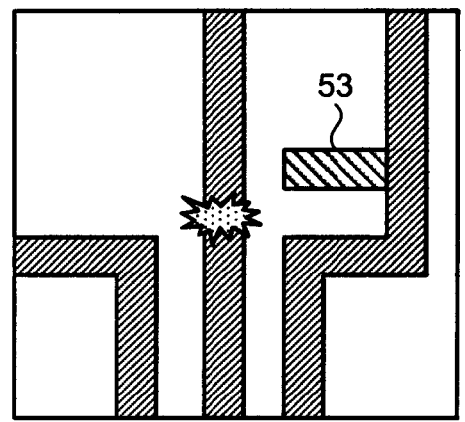
Figure 6D:
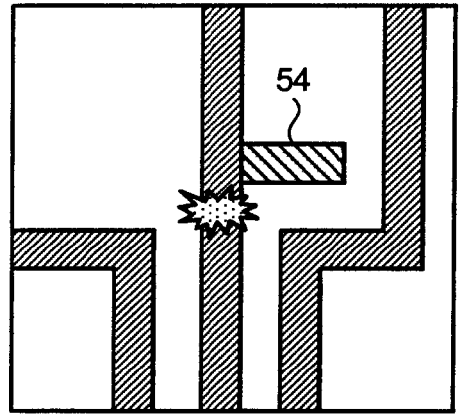
Figure 7A:
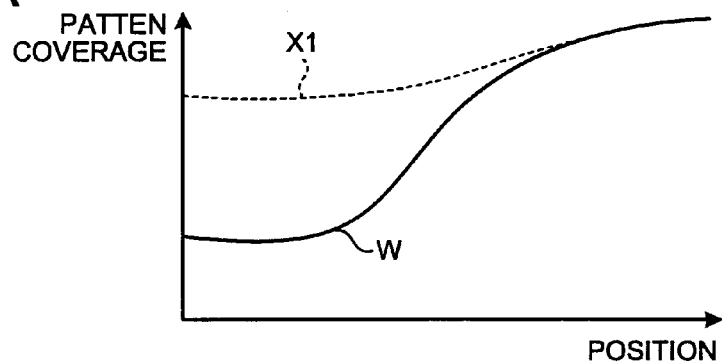
FIGS. 7A to 7D are diagrams for explaining corrected pattern coverages after the addition pattern candidates are added.
Figure 7B:
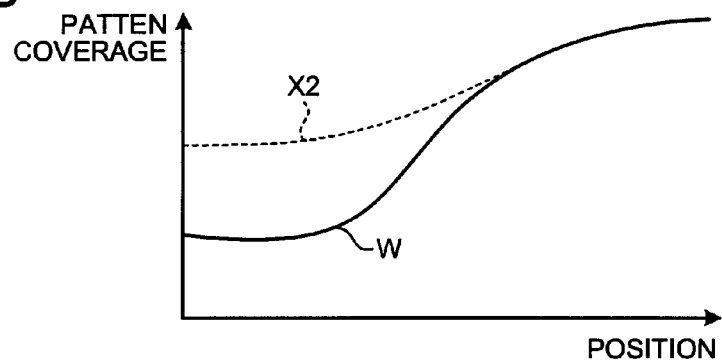
Figure 7C:
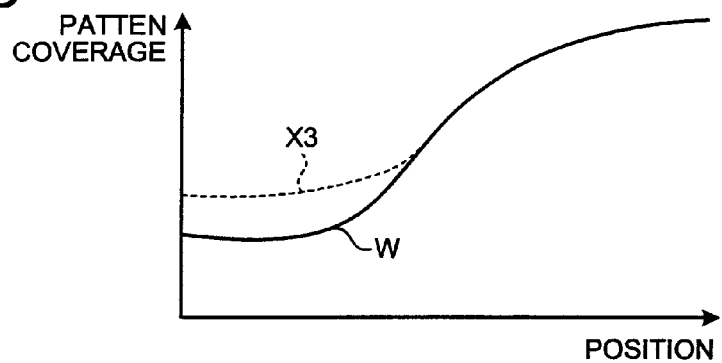
Figure 7D:
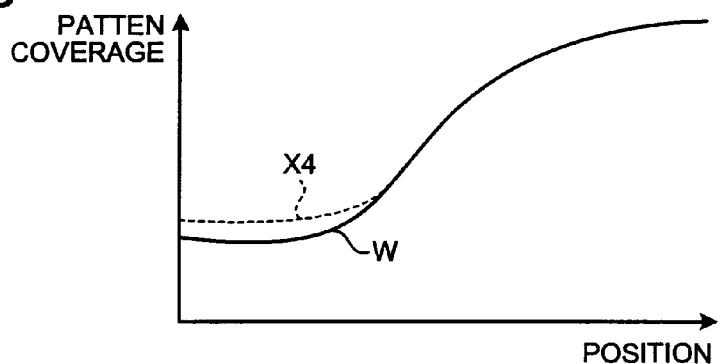

FIG. 5 is a diagram for explaining an addition pattern layout area. FIG. 5 is a top view illustrating a portion of the design layout in which the error pattern H occurs. For example, if the coverage computation area corresponding to the evaluation point B is selected, an addition pattern layout area 35 corresponding to that coverage computation area is selected. The addition pattern layout area 35 is set in a space area which does not overlap the line patterns L1 to L3. FIG. 5 shows a case where an area that includes the coverage computation area corresponding to the evaluation point B and does not overlap the line patterns L2 and L3 is set as the addition pattern layout area 35. The addition pattern layout area 35 may be set on the left side of the line pattern L2 where the evaluation point B has been set. In this case, the area that includes the coverage computation area corresponding to the evaluation point B and does not overlap the line patterns L1 and L2 is set as the addition pattern layout area 35.

The addition-pattern-candidate generating unit 16 generates one or more addition pattern candidates to be added to the addition pattern layout area 35 in step S50. The addition-pattern-candidate generating unit 16 transmits the addition pattern candidates to the coverage computing unit 15.

FIGS. 6A to 6D are diagrams illustrating examples of the addition pattern candidates. FIGS. 6A to 6D are top views illustrating cases where addition pattern candidates have been added to the design layout shown in FIG. 5. FIGS. 6A to 6D show addition pattern candidates 51 to 54, respectively.

The addition pattern candidates 51 to 54 are generated within a design rule range. The addition pattern candidates 51 to 54 may be generated so as not to be connected to the error pattern H. Further, the addition pattern candidates 51 to 54 may be generated such that distances between the addition pattern candidates and the error pattern become short. Further, the addition pattern candidates 51 to 54 may be generated such that the line patterns are not connected to each other through the addition pattern candidates 51 to 54. In other words, the addition pattern candidates 51 to 54 of a range having no influence on wire connection information of the design layout are generated. Further, the addition pattern candidates 51 to 54 may be generated such that the areas of the addition pattern candidates 51 to 54 are equal to each other. Further, the addition pattern candidates 51 to 54 may be generated such that a difference in the distribution of the corrected pattern coverages between the coverage computation areas becomes small. The addition pattern candidates 51 to 54 may be generated so as to be connected to any line pattern.

The addition-pattern-candidate generating unit 16 checks whether it has been possible to generate addition pattern candidates, in step S60. In a case where it has not been possible to generate addition pattern candidates (No in step S60), the addition-pattern-candidate generating unit 16 changes an addition-pattern-candidate generation condition in step S65. For example, the addition-pattern-candidate generating unit 16 resets the addition pattern layout area 35 as the addition-pattern-candidate generation condition. As the process of resetting the addition pattern layout area 35, a scale-up process or the like is performed on the addition pattern layout area 35. Then, the design-layout correcting apparatus 1 performs the processes of steps S50 and S60.

The design-layout correcting apparatus 1 repeats the processes of steps S50 and S60 until addition pattern candidates can be generated. In a case where it is not possible to generate addition pattern candidates even if the processes of steps S50 and S60 are repeated, the coverage-computation-area setting unit 14 may reset the coverage computation areas for the error pattern H. For example, as the process of resetting the coverage computation areas, a scale-up process or a scale-down process may be performed on the coverage computation areas. The design-layout correcting apparatus 1 performs the processes of steps S30 to S60. The design-layout correcting apparatus 1 repeats the processes of steps S30 to S60 until any addition pattern candidates can be generated.

In a case where it has been possible to generate addition pattern candidates (Yes in step S60), the coverage computing unit 15 computes a pattern coverage in a case where each of the addition pattern candidates is added to the selected coverage computation area, as the corrected pattern coverage for the corresponding addition pattern candidate in step S70.

The addition-pattern-candidate generating unit 16 associates the position of the error pattern, the addition pattern candidates, the uncorrected pattern coverages, and the corrected pattern coverages with one another, and transmits the associated information as the addition-pattern-candidate information to the addition-pattern-candidate-information storage unit 17.

Then, the addition-pattern selecting unit 19 sets a selection priority for each of the addition pattern candidates, on the basis of the addition pattern selection criteria in the selection-criteria storage unit 18 and the addition-pattern-candidate information in the addition-pattern-candidate-information storage unit 17, in step S75. The selection priorities are priorities for selecting each of the addition pattern candidates, and an addition pattern candidate with the highest selection priority is selected.

The addition-pattern selecting unit 19 associates the selection priorities with the addition pattern candidates of the addition-pattern-candidate information, and stores the associated information as new addition-pattern-candidate information in the addition-pattern-candidate-information storage unit 17. Further, the addition-pattern selecting unit 19 selects an addition pattern candidate with the highest selection priority for each error pattern as an addition pattern to be applied for correcting the design layout in step S80.

The addition-pattern selecting unit 19 may select an addition pattern such that the difference in the distribution of the corrected pattern coverages between the coverage computation areas becomes small. In other words, the addition-pattern selecting unit 19 selects an addition pattern capable of changing a position with a small uncorrected pattern coverage to a large corrected pattern coverage, from the addition pattern candidates in step S80. For example, at the individual evaluation points, the uncorrected pattern coverages have different values. In this case, an addition pattern may be selected such that the corrected pattern coverage at a position representing the smallest uncorrected pattern coverage becomes approximate to the maximum value of the uncorrected pattern coverages.

FIGS. 7A to 7D are diagrams for explaining the corrected pattern coverages after the addition pattern candidates are added. FIGS. 7A to 7D show corrected pattern coverages in cases where the addition pattern candidates 51 to 54 shown in FIGS. 6A to 6D have been added to the design layout. FIGS. 7A to 7D show the corrected pattern coverages of the addition pattern candidates 51 to 54 shown in FIGS. 6A to 6D, respectively.

As shown in FIGS. 7A to 7D, distributions of corrected pattern coverage of the cases where the addition pattern candidates 51 to 54 have been added are distributions X1 to X4, respectively. The distribution X1 corresponding to the addition pattern candidate 51 has the smallest amount of change and thus is most stable. The distribution X2 corresponding to the addition pattern candidate 52 has the second smallest amount of change. The distribution X3 corresponding to the addition pattern candidate 53 has the third smallest amount of change. The distribution X4 corresponding to the addition pattern candidate 54 has the largest amount of change and thus is most unstable.

Therefore, the selection priorities may be set in order of the addition pattern candidate 51, the addition pattern candidate 52, the addition pattern candidate 53, and the addition pattern candidate 54. In other words, the selection priorities may be set according to the degrees of alleviation of the inclinations of the distributions of the corrected pattern coverages. Here, the addition-pattern selecting unit 19 selects the addition pattern candidate 51 and adds the addition pattern candidate 51 to the design layout in step S90. The addition-pattern selecting unit 19 transmits the design layout with the addition pattern candidate 51 (corrected design layout) to the output unit 20.

A design rule check (DRC) is performed on the corrected design layout by a DRC apparatus or the like. At this time, minimum dimension information and the like included in the DRC may be given as a rule in advance. Further, the DRC on the corrected design layout may be performed using dimension information of the vicinity of the error position in the uncorrected design layout or the entire uncorrected design layout. If the corrected design layout passes the DRC, the mask-pattern generating apparatus 3 performs the MDP on the corrected design layout so as to generate a mask pattern. Then, the error-pattern extracting apparatus 2 performs the LCC using the mask pattern in step S100.

Pass/fail information on whether any addition pattern candidates have passed the LCC is input from the error-pattern extracting apparatus 2 to the input unit 11. The input unit 11 stores the LCC pass/fail information in the selection-criteria storage unit 18. If the pass/fail information is stored, in the selection-criteria storage unit 18, the addition-pattern selecting unit 19 and the addition-pattern-candidate generating unit 16 read out the pass/fail information.

In a case where the addition pattern candidate passes the LCC (Yes in step S110), the design-layout correcting process is completed. Meanwhile, in a case where the addition pattern candidate fails the LCC (No in step S110), in order to replace the addition pattern candidate with another addition pattern candidate, the addition-pattern selecting unit 19 and the addition-pattern-candidate generating unit 16 determine whether there are any remaining unselected addition pattern candidates, in step S120.

In a case where there are any remaining unselected addition pattern candidates (Yes in step S120), the addition-pattern selecting unit 19 selects an addition pattern candidate with the highest selection priority, from the remaining addition pattern candidates in step S80, and adds the selected addition pattern candidate to the design layout in step S90. Here, the addition pattern candidate 52 with the second highest selection priority is selected.

Then, the MDP and LCC processes are performed in step S100, and it is determined whether the selected addition pattern candidate has passed the LCC, in step S110. In a case where the selected addition pattern candidate has failed the LCC (No in step S110), the addition-pattern selecting unit 19 determines whether there are any remaining unselected addition pattern candidates in step S120.

In a case where there are no remaining unselected addition pattern candidates (No in step S120), the addition-pattern-candidate generating unit 16 changes the addition-pattern-candidate generation condition in step S130. For example, the addition-pattern-candidate generating unit 16 performs the scale-up process or the like on the addition pattern layout area 35, as the process of resetting the addition pattern layout area 35. Next, the design-layout correcting apparatus 1 performs the processes of steps S50 to S110. The design-layout correcting apparatus 1 repeats the processes of steps S50 to S110 until it is possible to generate any addition pattern candidates. In a case where the selected addition pattern candidate does not pass the MDP/LCC, the processes of steps S120 and S130 and the like are performed.

In a case where any selected addition pattern candidate fails the MDP/LCC even if the processes of step S50 to S110 are repeated a predetermined number of times, the coverage-computation-area setting unit 14 may reset the coverage computation areas for the error pattern H.

The correction of the design-layout correcting apparatus 1 on the design layout (addition of an addition pattern) may be performed for each layer of a wafer process. Then, if necessary, a mask pattern may be generated using the corrected design layout, and a mask may be formed using the mask pattern. Next, a semiconductor device (semiconductor integrated circuit) may be manufactured using the mask. Specifically, the mask may be formed using the mask pattern generated using the corrected design layout, exposure on a wafer with a resist applied thereon may be performed using the mask, and the wafer may be developed, such that a resist pattern is formed on the wafer. Next, etching on a lower layer side of the wafer may be performed using the resist pattern as a mask. In this way, an actual pattern corresponding to the corrected design layout may be formed on the wafer. When a semiconductor device is manufactured, the design-layout correcting process, the mask-pattern generating process, the mask forming process, the exposure process, the development process, the etching process, and the like are repeated for each layer.

Figure 8:
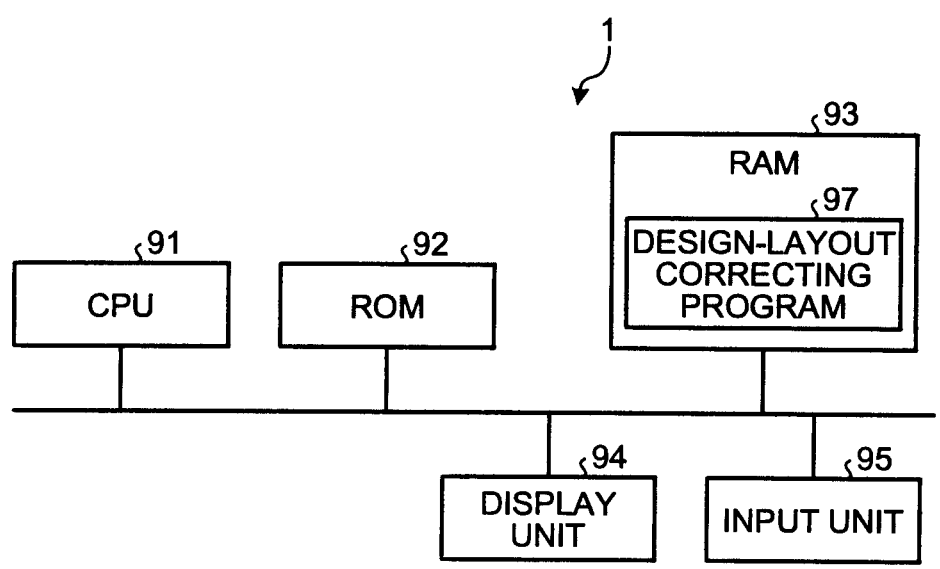
FIG. 8 is a diagram illustrating a hardware configuration of the design-layout correcting apparatus.

Next, a hardware configuration of the design-layout correcting apparatus 1 will be described. FIG. 8 is a diagram illustrating a hardware configuration of the design-layout correcting apparatus. The design-layout correcting apparatus 1 includes a central processing unit (CPU) 91, a read only memory (ROM) 92, a random access memory (RAM) 93, a display unit 94, and an input unit 95. In the design-layout correcting apparatus 1, the CPU 91, the ROM 92, the RAM 93, the display unit 94, and the input unit 95 are connected through bus lines.

The CPU 91 performs correction on the design layout using a design-layout correcting program 97 which is a computer program. The display unit 94 is a display device such as a liquid crystal monitor, and displays the uncorrected design layout, the position of the error pattern H, the positions of the evaluation points for computing the uncorrected pattern coverages, the coverage computation areas, the addition pattern layout area 35, the addition pattern candidates, the distribution of the corrected pattern coverages, the selection priorities, the corrected design layout, and the like, on the basis of an instruction of the CPU 91. The input unit 95 is configured to include a mouse or a keyboard, and receives instruction information (such as parameters necessary for correcting the design layout) externally input by a user. The instruction information input to the input unit 95 is transmitted to the CPU 91.

The design-layout correcting program 97 is stored in the ROM 92, and is loaded into the RAM 93 through the bus lines. FIG. 8 shows a state in which the design-layout correcting program 97 has been loaded into the RAM 93.

The CPU 91 executes the design-layout correcting program 97 loaded in the RAM 93. Specifically, in the design-layout correcting apparatus 1, according to the instruction entered by the user through the input unit 95, the CPU 91 reads the design-layout-correcting program 97 out of the ROM 92, and develops the design-layout correcting program 97 in a program storage area in the RAM 93, so as to execute various processes. The CPU 91 temporality stores various kinds of data generated during the various processes in a data storage area formed in the RAM 93.

The design-layout correcting program 97 executed in the design-layout correcting apparatus 1 has a module configuration including the coverage-computation-area setting unit 14, the coverage computing unit 15, the addition-pattern-candidate generating unit 16, and the addition-pattern selecting unit 19, which are loaded on a main storage device and are generated on the main storage device.

In the present embodiment, a case where the design layout is a line pattern has been described; however, the design layout may be a contact-hole pattern. Further, in the present embodiment, a case where one addition pattern is added to the addition pattern layout area 35 has been described; however, a plurality of addition patterns may be added to the addition pattern layout area 35. Furthermore, a plurality of addition pattern layout areas 35 may be set, and an addition pattern may be added to each of the addition pattern layout areas 35.

Moreover, addition pattern candidates for the design layout of the area where the error pattern H occurs may be registered in a database or the like, and may be used at the next and subsequent times when addition pattern candidates are generated.

According to the embodiments, since an addition pattern is added to a design layout so as to reduce a change in the pattern coverage in the vicinity of an error pattern in a case where an on-substrate pattern is formed, it is possible to effectively correct the design layout of the vicinity of the error pattern.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern correcting method comprising:
   computing, using a computer, a distribution of pattern coverages on a design layout of a circuit pattern in a vicinity of a position where an on-substrate pattern corresponding to the design layout becomes an error pattern when the on-substrate pattern is formed on a substrate;
   setting an area on the design layout as an addition area so that an amount of change in the distribution of the pattern coverages, after adding an addition pattern to the design layout, becomes smaller than the amount of change before adding the addition pattern;
   generating addition pattern candidates to be added to the addition area; and
   selecting an addition pattern to be added to the design layout, from the addition pattern candidates on the basis of a predetermined selection criterion, and adding the selected addition pattern to the addition area.

2. The pattern correcting method according to claim 1, wherein when the pattern coverages are computed, a plurality of evaluation points are set on a design pattern generating the error pattern, areas in a predetermined range from each of the set evaluation points are set as evaluation areas for computing the distribution of the pattern coverages, and the pattern coverages are computed for each of the set evaluation areas.

3. The pattern correcting method according to claim 1, wherein the selection criterion is set such that an addition pattern candidate making the amount of change in the distribution of the pattern coverages the smallest is preferentially selected as the addition pattern.

4. The pattern correcting method according to claim 3, wherein the selection criterion is set such that when a plurality of addition pattern candidates making the amount of change in the distribution of the pattern coverages the smallest is selected, an addition pattern candidate closest to the error pattern is preferentially selected as the addition pattern from the plurality of selected addition pattern candidates.

5. The pattern correcting method according to claim 1, wherein the selection criterion is set such that an addition pattern candidate closest to the error pattern is preferentially selected as the addition pattern.

6. The pattern correcting method according to claim 5, wherein the selection criterion is set such that when a plurality of addition pattern candidates closest to the error pattern is selected, an addition pattern candidate making the amount of change in the distribution of the pattern coverages the smallest is preferentially selected as the addition pattern from the plurality of selected addition pattern candidates.

7. The pattern correcting method according to claim 1, wherein the addition pattern candidates are addition patterns having no influence on wire connection information of the design layout.

8. The pattern correcting method according to claim 1, wherein the addition pattern candidates are addition patterns disconnected from the error pattern.

9. A mask forming method comprising:
   computing, using a computer, a distribution of pattern coverages on a design layout of a circuit pattern in a vicinity of a position where an on-substrate pattern formed on a substrate corresponding to the design layout becomes an error pattern when the on-substrate pattern is formed on a substrate;
   setting an area on the design layout as an addition area so that an amount of change in the distribution of the pattern coverages, after adding an addition pattern is added to the design layout, becomes smaller than the amount of change before adding the addition pattern;
   generating addition pattern candidates to be added to the addition area;
   selecting an addition pattern to be added to the design layout, from the addition pattern candidates on the basis of a predetermined selection criterion, and adding the selected addition pattern to the addition area;
   generating a mask pattern using the design layout with the addition pattern added thereto; and
   forming a mask using the mask pattern.

10. The mask forming method according to claim 9, wherein when the pattern coverages are computed, a plurality of evaluation points are set on a design pattern generating the error pattern, areas in a predetermined range from each of the set evaluation points are set as evaluation areas for computing the distribution of the pattern coverages, and the pattern coverages are computed for each of the set evaluation areas.

11. The mask forming method according to claim 9, wherein the selection criterion is set such that an addition pattern candidate making the amount of change in the distribution of the pattern coverages the smallest is preferentially selected as the addition pattern.

12. The mask forming method according to claim 11, wherein the selection criterion is set such that when a plurality of addition pattern candidates making the amount of change in the distribution of the pattern coverages the smallest is selected, an addition pattern candidate closest to the error pattern is preferentially selected as the addition pattern from the plurality of selected addition pattern candidates.

13. The mask forming method according to claim 9, wherein the selection criterion is set such that an addition pattern candidate closest to the error pattern is preferentially selected as the addition pattern.

14. The mask forming method according to claim 13, wherein the selection criterion is set such that when a plurality of addition pattern candidates closest to the error pattern is selected, an addition pattern candidate making the amount of change in the distribution of the pattern coverages the smallest is preferentially selected as the addition pattern from the plurality of selected addition pattern candidates.

15. A method of manufacturing a semiconductor device comprising:
   computing a distribution of pattern coverages on a design layout of a circuit pattern in a vicinity of a position where an on-substrate pattern formed on a substrate corresponding to the design layout becomes an error pattern when the on-substrate pattern is formed on a substrate;
   setting an area on the design layout as an addition area so that an amount of change in the distribution of the pattern coverages, after adding an addition pattern is added to the design layout becomes smaller than the amount of change before adding the addition pattern;
   generating addition pattern candidates to be added to the addition area;
   selecting an addition pattern to be added to the design layout, from the addition pattern candidates on the basis of a predetermined selection criterion, and adding the selected addition pattern to the addition area;
   generating a mask pattern using the design layout with the addition pattern added thereto;
   forming a mask using the mask pattern; and
   forming an on-substrate pattern on a substrate using the mask.

16. The method of manufacturing a semiconductor device according to claim 15, wherein when the pattern coverages are computed, a plurality of evaluation points are set on a design pattern generating the error pattern, areas in a predetermined range from each of the set evaluation points are set as evaluation areas for computing the distribution of the pattern coverages, and the pattern coverages are computed for each of the set evaluation areas.

17. The method of manufacturing a semiconductor device according to claim 15, wherein the selection criterion is set such that an addition pattern candidate making the amount of change in the distribution of the pattern coverages the smallest is preferentially selected as the addition pattern.

18. The method of manufacturing a semiconductor device according to claim 17, wherein the selection criterion is set such that, when a plurality of addition pattern candidates making the amount of change in the distribution of the pattern coverages the smallest is selected, an addition pattern candidate closest to the error pattern is preferentially selected as the addition pattern from the plurality of selected addition pattern candidates.

19. The method of manufacturing a semiconductor device according to claim 15, wherein the selection criterion is set such that an addition pattern candidate closest to the error pattern is preferentially selected as the addition pattern.

20. The method of manufacturing a semiconductor device according to claim 19, wherein the selection criterion is set such that when a plurality of addition pattern candidates closest to the error pattern is selected, an addition pattern candidate making the amount of change in the distribution of the pattern coverages the smallest is preferentially selected as the addition pattern from the plurality of selected addition pattern candidates.

* * * * *